United States Patent
LeBlanc et al.

(10) Patent No.: US 6,748,563 B1
(45) Date of Patent: Jun. 8, 2004

(54) METHOD AND APPARATUS FOR TESTING PATH DELAYS IN A HIGH-SPEED BOUNDARY SCAN IMPLEMENTATION

(75) Inventors: Johnny James LeBlanc, Austin, TX (US); Timothy Skergan, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 609 days.

(21) Appl. No.: 09/704,956

(22) Filed: Nov. 2, 2000

(51) Int. Cl.[7] .............................. G11R 31/28

(52) U.S. Cl. ...................... 714/727; 714/724

(58) Field of Search ................ 714/724, 726, 714/727, 731, 738, 815; 713/500, 501, 600; 327/293

(56) References Cited

U.S. PATENT DOCUMENTS

| | | | | |
|---|---|---|---|---|
| 5,740,410 A | * | 4/1998 | McDermott | |
| 6,091,261 A | * | 7/2000 | De Lange | |
| 6,151,682 A | * | 11/2000 | Van Der Wal et al. | 713/401 |
| 6,219,813 B1 | * | 4/2001 | Bishop et al. | 714/736 |

* cited by examiner

Primary Examiner—Phung M. Chung
(74) Attorney, Agent, or Firm—Casimer K. Salys; Bracewell & Patterson, L.L.P.

(57) ABSTRACT

A method and apparatus for testing path delays in a high-speed boundary scan implementation overcomes limitations imposed by pipelined high-speed clocking architectures used in integrated circuits. A special phase hold circuit provides a mechanism for clocking circuits undergoing dynamic tests, permitting the dynamic test to produce proper results when the integrated circuit under test is clocked with a high-speed distributed clock. The functional logic clock enable is pipelined to synchronize the functional mode clock with the test mode clock when the tester mode is switched.

17 Claims, 5 Drawing Sheets

METHOD AND APPARATUS FOR TESTING PATH DELAYS IN A HIGH-SPEED BOUNDARY SCAN IMPLEMENTATION

CROSS-REFERENCES TO RELATED APPLICATIONS

The present invention relates to U.S. patent application Ser. No. 09/436,112 entitled "METHOD AND APPARATUS FOR SCANNING AND CLOCKING CHIPS WITH A HIGH-SPEED FREE RUNNING CLOCK IN A MANUFACTURING TEST ENVIRONMENT" filed Nov. 8, 1999, which is incorporated herein by reference, and which is now as U.S. Pat. No. 6,452,435.

The present invention also relates to U.S. patent application Ser. No. 09/436,111 entitled "METHOD AND APPARATUS FOR IMPLEMENTING IEEE 1149.1 COMPLIANT BOUNDARY SCAN" filed Nov. 8, 1999, which is incorporated herein by reference, and which is now as U.S. Pat. No. 6,539,491.

BACKGROUND OF THE INVENTION

1. Technical Field

The present invention relates generally to boundary scan testing in integrated circuits, and more particularly, to boundary scan dynamic testing in an integrated circuit having pipelined clock distribution.

2. Description of the Related Art

Functional testing of integrated circuits and printed circuit boards is necessary to assure defect-free products. Using a low pin-count serial interface, the Joint Test Action Group (JTAG) interface provides a mechanism for testing both the internal features of an integrated circuit and the connections between two integrated circuits mounted on a printed circuit board or other substrate. The details of the JTAG interface are defined by IEEE (Institute of Electrical and Electronics Engineers) standard 1149.1—IEEE Standard Test Access Port and Boundary Scan Architecture.

Present implementations of boundary scan circuits require special control of the boundary scan latch clock signals. The boundary scan latches are typically implemented in pairs, with one latch a master for holding scan data and one latch a slave for maintaining the scan data as it is clocked into an adjacent block. The blocks are serially connected in scan chains, permitting values to be shifted in and out of the blocks without a parallel signal connection.

In integrated circuits such as microprocessors that normally operate at high frequencies, dynamic tests, commonly referred to as "A/C tests" can be performed by ensuring that the tester clock used during the test is at a frequency low enough for functional logic path delays to be overcome by the time the test results are sampled. These tests may test functional logic, such as bus interface connections, that run at a slower clock frequency than the microprocessor system clock. The clocks in these portions of the logic are commonly clocked at a clock frequency produced by dividing the system clock via an N:1 divider that may be programmable.

However, in clocking schemes such as the pipelined clock architecture disclosed in "METHOD AND APPARATUS FOR SCANNING AND CLOCKING CHIPS WITH A HIGH-SPEED FREE RUNNING CLOCK IN A MANUFACTURING TEST ENVIRONMENT," the use of pipelined control signals introduces pipeline delays and prevent the possibility of setting functional logic values and receiving correct test results from logic having path delays longer than a mesh clock cycle.

In light of the foregoing, it would be desirable to provide a method and apparatus for testing path delays in an integrated circuit having a high-speed boundary scan implementation.

SUMMARY OF THE INVENTION

The objective of performing path delay tests in an integrated circuit having a high-speed boundary scan implementation is accomplished in a method and apparatus for testing path delays. The edge of a tester clock is detected and a clock generating circuit produces a waveform for clocking functional logic within the integrated circuit, where the internal clock is started in response to detection of the edge of the tester clock.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

DESCRIPTION OF AN ILLUSTRATIVE EMBODIMENT

Figure 1:
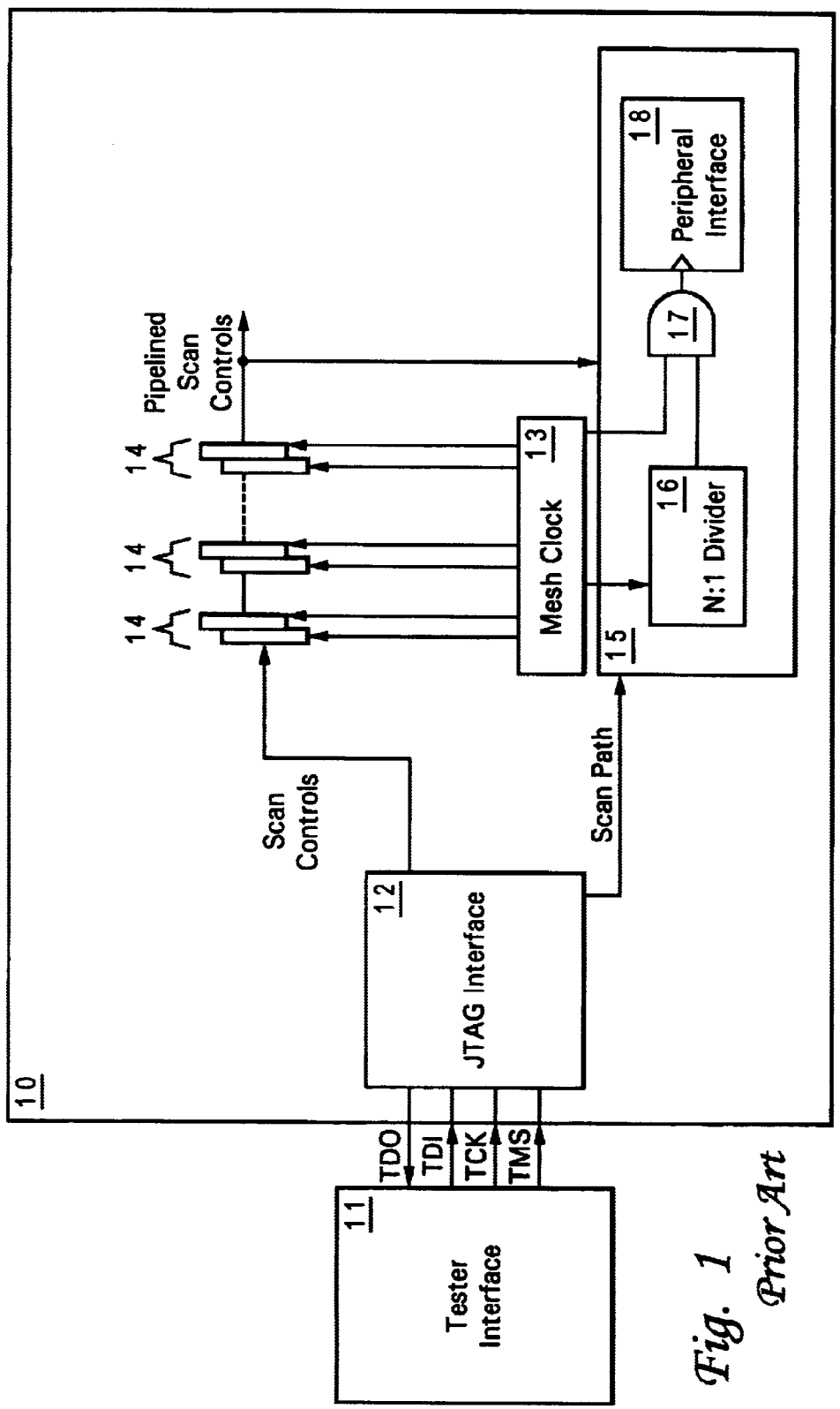
FIG. 1 is a block diagram of a prior art integrated circuit including pipelined test control.

With reference now to the figures, and in particular with reference to FIG. 1, there is depicted a prior art integrated circuit 10 including pipelined test control. A tester interface 11 is coupled to a Joint Test Action Group (JTAG) interface 12 within integrated circuit 10, which contains boundary scan circuits. The boundary scan blocks comprise master/slave latch pairs connected serially in scan pipelines to load test data into functional logic 15 or read data from functional logic 15. Within functional logic 15, there is depicted an N:1 divider 16, coupled to peripheral interface 18, by AND gate 17. This circuit is included as an example of the circuit that generally occurs in integrated circuits, particularly "systems silicon," wherein divisions of a master clock may be used to generate slower signals for use within the integrated circuit functional logic 15, or to interface to external buses and components. Peripheral interface 18 is an example of this type of circuit, in which a division of mesh clock 13 is used to enable a mesh clock 13 output via AND gate 17 to clock peripheral interface 18 at a slower clock speed than the master clock (mesh clock 13).

When performing path delay tests on functional logic 15 in the prior art circuit, it is not possible to load blocks within N:1 divider 16 and have peripheral interface 18 properly clocked to allow path delay testing because a static value is loaded into the blocks within N:1 divider 16. As soon as mesh clock 13 clocks these circuits, the values loaded will be clocked out, preventing AND gate 17 from enabling the mesh clock 13 output to peripheral interface 18 at the proper time for the logic within peripheral interface 18 to be scanned by the tester. Since mesh clock is running at the tester clock frequency, which is a high-frequency clock even in the test environment, the loaded values will be clocked out before the scan control signals have propagated through the pipeline latches 14.

Figure 2:
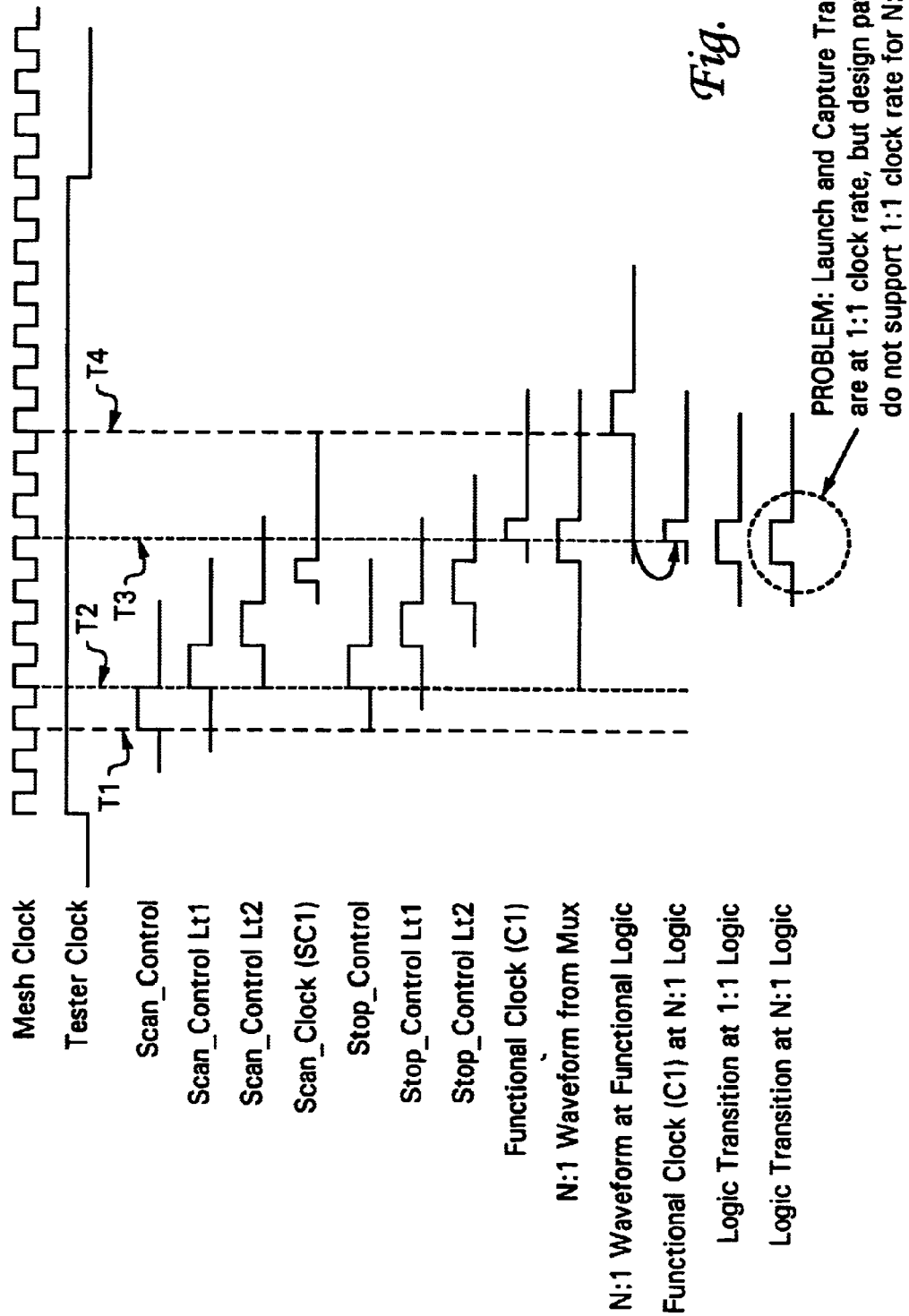
FIG. 2 is a timing diagram showing the relationship of signals within the integrated circuit of FIG. 1.

Referring now to FIG. 2, the timing relationships of signals within integrated circuit 10 are shown. At time T1, the $scan_{13}$ control start signal is asserted from JTAG interface 12. The scan_control signal is clocked through master slave latch pairs 14, and at the local functional logic blocks within functional logic 15, the scan clock sc1 causes a value to set the output of N:1 divider 16 to be loaded from the scan multiplexers. But, at time T3, this value has not propagated to functional logic 15. At time T4, the N:1 clock value has propagated to the registers within functional logic 15, e.g., N:1 divider 16, but stop_control was launched into it's pipeline at time T1 and the pulse on functional clock C1 has already expired after time T3. An invalid result is produced in the scan due to the N:1 waveform clocking early. One partial solution that will produce consistent test results is to force the N:1 waveform to be in a hold value (clock disable) at the transition to functional mode. This prevents the logic transition from occurring in the N:1 logic, but does not permit testing. A preferred alternative is to redesign the functional logic and test logic to permit A/C testing by pipelining the functional logic N:1 clock and producing a proper N:1 waveform while integrated circuit 10 is in scan mode.

Figure 3:
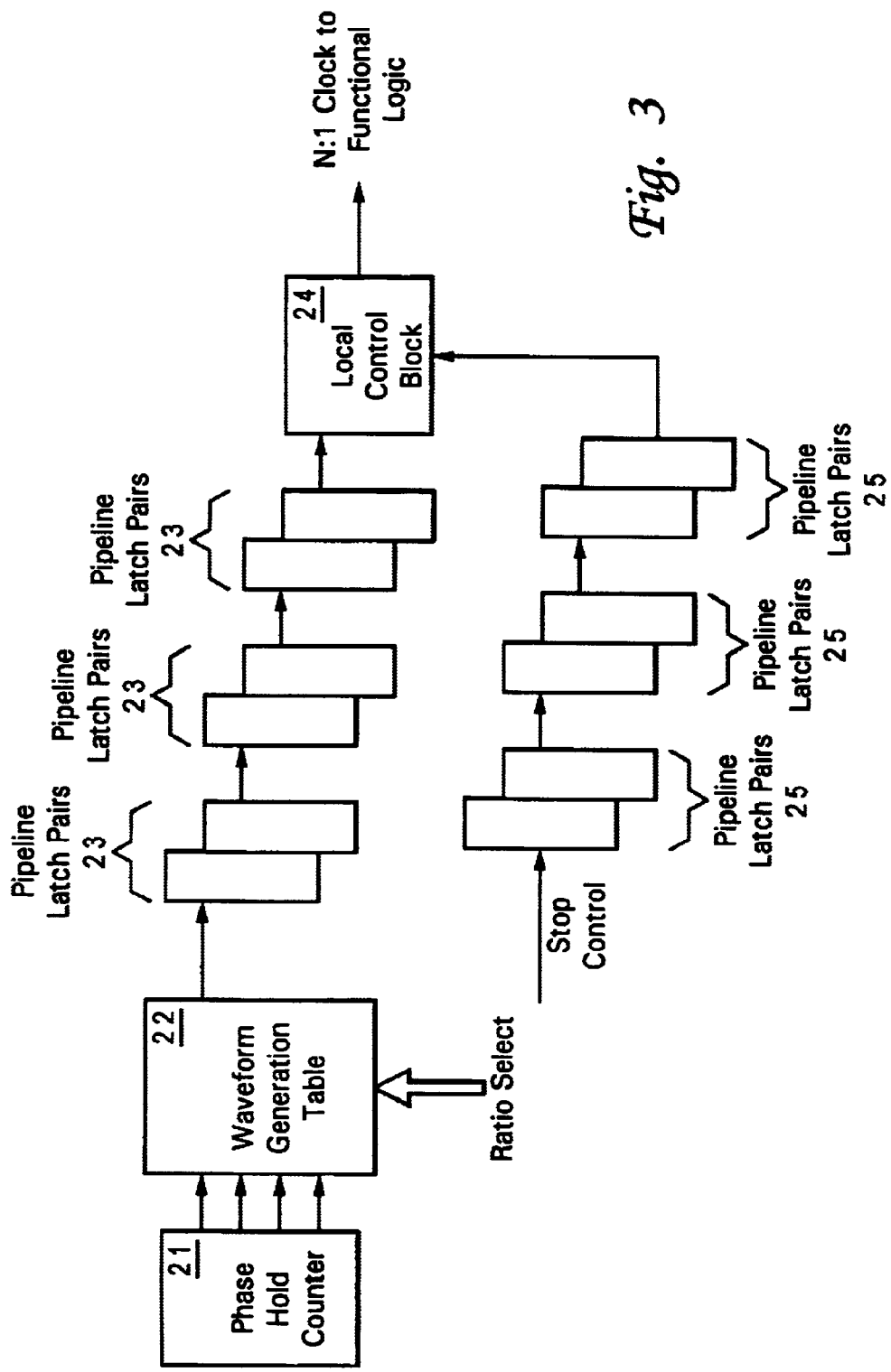
FIG. 3 is a schematic diagram depicting a pipelined clocking circuit in accordance with a preferred embodiment of the present invention.

Referring now to FIG. 3, a schematic diagram of a pipelined clocking circuit in accordance with a preferred embodiment of the present invention is depicted. Phase hold counter 21 coupled to waveform generation table 22 is an implementation of N:1 divider 16 designed to produce waveforms compatible with the test circuits of the present invention. A frequency division ratio is selected by selecting a table within waveform generation table 22 to produce a frequency division proper for clocking the slower functional logic (Logic having path delays greater one mesh clock cycle). Pipeline latch pairs 23 are master-slave latch pairs clocked by complementary outputs of mesh clock 13. The stop control signal is also pipelined through pipeline latch pairs 25, so that the stop control signal arrives at local control block 24 aligned with the output of waveform generation table 22.

TABLE 1

| Count | 1:1 | 2:1 | 3:1 | 4:1 | 6:1 |
| --- | --- | --- | --- | --- | --- |
| 0 | 0 | 0 | 0 | 0 | 0 |
| 1 | 0 | 1 | 1 | 1 | 1 |
| 2 | 0 | 0 | 1 | 1 | 1 |
| 3 | 0 | 1 | 0 | 1 | 1 |
| 4 | 0 | 0 | 1 | 0 | 1 |
| 5 | 0 | 1 | 1 | 1 | 1 |
| 6 | 0 | 0 | 0 | 1 | 0 |
| 7 | 0 | 1 | 1 | 1 | 1 |
| 8 | 0 | 0 | 1 | 0 | 1 |
| 9 | 0 | 1 | 0 | 1 | 1 |
| 10 | 0 | 0 | 1 | 1 | 1 |
| 11 | 0 | 1 | 1 | 1 | 1 |

Table 1 depicts the values in waveform generation table 22 for the count value input from phase hold counter 21. By setting the ratio select signals controlling waveform generation table 22, a ratio may be selected to properly clock the functional logic in scan mode. By choosing a cycle count of 12 in the design, ratios from 1–4 and 6 can be supported.

Figure 4:
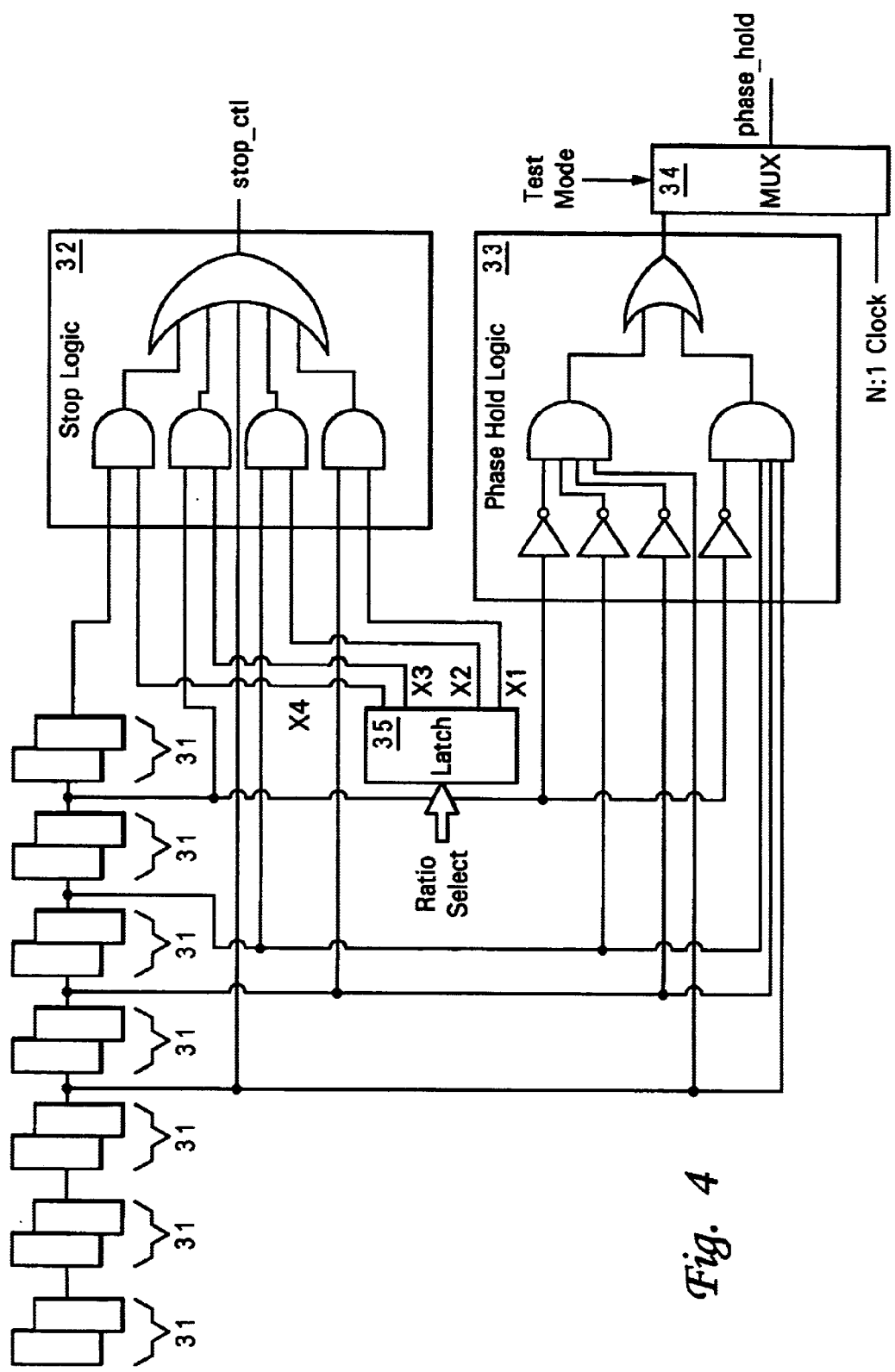
FIG. 4 is a schematic diagram of a test clock circuit in accordance with a preferred embodiment of the present invention.

Referring now to FIG. 4, a test clock circuit in accordance with a preferred embodiment of the invention is depicted. Master-slave latch pairs 31 pipeline the tester clock signal received from JTAG interface 12, and combinatorial logic blocks produce the stop control and functional clocks when the tester clock transitions. Stop logic 32 combines the tester clock from the third of master-slave latch pairs 31 with a selected output from a master-slave latch pair 31 further down the pipeline. This stretches the stop_ctl signal to extend to the proper period of the N:1 clock.

Phase hold logic 33 produces a waveform to enable mesh clock 13 to clock functional logic 15 blocks. The tester clock propagating through master-slave latch pairs 31 causes the output of phase hold logic 33 to transition high for one mesh clock period, low for two mesh clock periods, then high again for one mesh clock period. Multiplexer 34 selects between the output of phase hold logic 33 when integrated circuit 10 is in scan mode and N:1 clock produced by waveform generator 22 when integrated circuit 10 is in functional mode.

Figure 5:
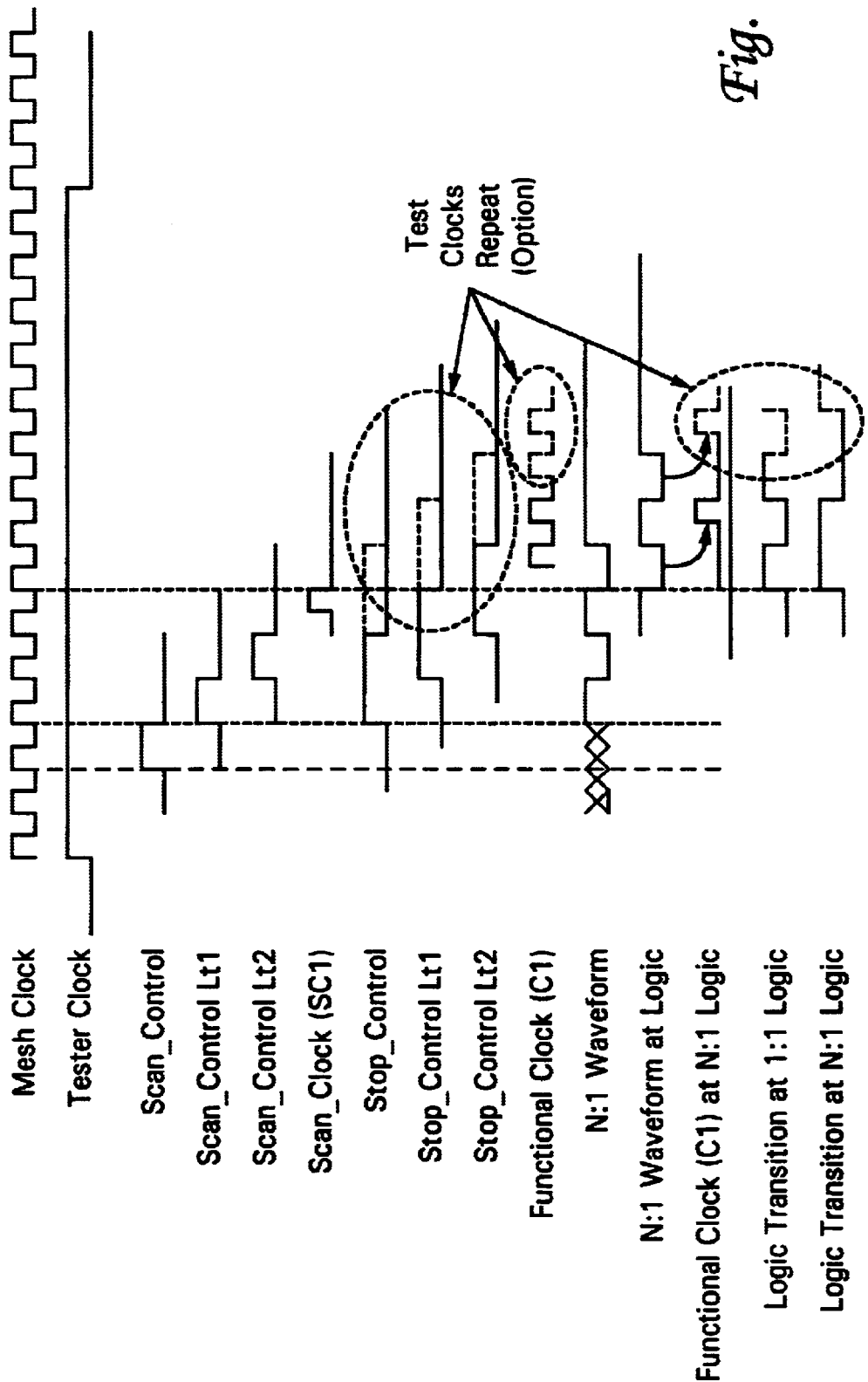
FIG. 5 is a timing diagram depicting the relationship of signals in the clocking circuit of FIG. 3 and the test clock circuit of FIG. 4.

Referring now to FIG. 5, the timing relationships in the circuits of the preferred embodiment of the present invention are depicted. The pipelined stop_control signals are stretched so that they can be extended past the end of stop_control, and functional clock C1 is periodic, since the mesh clock is gated by the phase_hold signal to produce this clock. The N:1 waveform can now gate the functional clock so that logic transitions can be made in functional logic 15 (from FIG. 1) prior to the expiration of the extended stop_control signal.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. It is therefore contemplated that such modifications can be made without departing from the spirit or scope of the present invention as defined in the appended claims.

What is claimed is:

1. A method for performing a path delay test in functional logic within an integrated circuit, said method comprising:

detecting a start of a tester clock cycle;

generating an internal clock for clocking said functional logic by dividing a master clock, wherein said internal clock is started in response to a detection of an edge of said tester clock cycle, wherein said internal clock clocks said functional logic to complete said path delay test during said tester clock cycle; and extending a stop control signal so that said stop control signal extends for a period of said internal clock, wherein said stop control signal is a signal that ends said path delay test.

2. The method of claim 1, wherein said detecting further includes detecting a start control signal for indicating a start of said path delay test.

3. The method of claim 2, further comprising selecting a divisor for said internal clock so that a path delay of said functional logic is shorter than a period of said internal clock.

4. The method of claim 2, further comprising extending a stop control signal so that said stop control signal extends for a period of said internal clock, wherein said stop control signal is a signal that ends said path delay test.

5. The method of claim 1, further comprising selecting a divisor for said internal clock so that a path delay of said functional logic is shorter than a period of said internal clock.

6. The method of claim 5, further comprising extending a stop control signal so that said stop control signal extends for a period of said internal clock, wherein said stop control signal is a signal that ends said path delay test.

7. The method of claim 1, wherein said functional logic is an interface for coupling to another integrated circuit, and wherein said generating generates said internal clock so that a period of said internal clock is longer than a path delay of said interface.

8. The method of claim 7, further comprising selecting a divisor for said internal clock so that a path delay of said functional logic is shorter than a period of said internal clock.

9. A test circuit for performing a path delay test in functional logic within an integrated circuit, wherein said test circuit comprising:

a test clock input for receiving a tester clock;

a clock generator coupled to said test clock input for generating an internal clock to clock said functional logic, wherein said internal clock is started after a detection of a start of a tester clock cycle, wherein said internal clock clocks said functional logic to complete said path delay test before the end of said tester clock cycle;

a stop latch for latching a stop signal to indicate an end of said path delay test; and a stop delay circuit for extending said stop signal until a period of said internal clock has expired.

10. The test circuit of claim 9, further comprising a start latch for latching a start signal indicating a start of said path delay test, wherein said clock generator generates said internal clock in response to said start signal.

11. The test circuit of claim 9, further comprising:

a waveform generator for generating a functional mode clock for clocking said functional logic when said integrated circuit is not in a test mode; and a pipeline coupling said waveform generator to said functional logic for delaying said functional mode clock.

12. The test circuit of claim 11, wherein said pipeline comprises cascaded master-slave latch pairs clocked by complementary clocks.

13. The test circuit of claim 11, further comprising:

a divider coupled to said waveform generator for dividing an output of said waveform generator to generate a plurality of subdivisions of said functional mode clock; and a selector for selecting one of said plurality of subdivisions for clocking said functional logic.

14. The test circuit of claim 9, wherein said stop delay circuit comprises:

a plurality of cascaded master-slave latch pairs, wherein a first one of said master-slave latch pairs is coupled to said test clock input; and an AND gate having inputs coupled to outputs of two of said master-slave latch pairs.

15. The test circuit of claim 14, further comprising a selector for selecting one of said two master-slave latch pairs.

16. The test circuit of claim 9, wherein said clock generator comprises a plurality of master-slave latch pairs, wherein a first one of said master-slave latch pairs is coupled to said test clock input, wherein said clock generator further comprises combinatorial logic coupled to outputs of said master-slave latch pairs for generating said internal clock.

17. The test circuit of claim 16, further comprising:

a waveform generator for generating a functional mode clock for clocking said functional logic when said integrated circuit is not in a test mode;

a pipeline coupled to said waveform generator for delaying said functional mode clock; and a multiplexer coupled to said pipeline and further coupled to said combinatorial logic for selecting between an output of said combinatorial logic and an output of said waveform generator.

* * * * *

UNITED STATES PATENT AND TRADEMARK OFFICE
CERTIFICATE OF CORRECTION

PATENT NO. : 6,748,563 B1
DATED : June 8, 2004
INVENTOR(S) : LeBlanc et al.

It is certified that error appears in the above-identified patent and that said Letters Patent is hereby corrected as shown below:

Title page,
Item [*] Notice, please replace notice with the following:
-- Subject to any disclaimer, the term of this patent is extended or adjusted under 35 U.S.C. 154(b) by 658 days. --

Signed and Sealed this

Twenty-eighth Day of June, 2005

JON W. DUDAS
*Director of the United States Patent and Trademark Office*